(12) United States Patent
Bedeschi et al.

(10) Patent No.: US 7,518,934 B2
(45) Date of Patent: Apr. 14, 2009

(54) PHASE CHANGE MEMORY WITH PROGRAM/VERIFY FUNCTION

(75) Inventors: Ferdinando Bedeschi, Biassono (IT); Richard E. Fackenthal, Carmichael, CA (US); Ruili Zhang, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/726,852

(22) Filed: Mar. 23, 2007

(65) Prior Publication Data

US 2008/0232171 A1 Sep. 25, 2008

(51) Int. Cl.
*G11C 7/00* (2006.01)
*G11C 7/18* (2006.01)

(52) U.S. Cl. .................... 365/189.18; 365/148; 365/163
(58) Field of Classification Search .................. 365/148, 365/163, 189.18
See application file for complete search history.

(56) References Cited

U.S. PATENT DOCUMENTS

| | | | |
|---|---|---|---|
| 5,532,964 A * | 7/1996 | Cernea et al. .......... | 365/189.09 |
| 6,256,248 B1 * | 7/2001 | Leung ................... | 365/222 |
| 6,292,398 B1 | 9/2001 | Pasotti et al. | |
| 6,768,665 B2 | 7/2004 | Parkinson et al. | |
| 6,937,522 B2 | 8/2005 | Funaki | |
| 2006/0002172 A1 * | 1/2006 | Venkataraman et al. ..... | 365/148 |
| 2006/0126380 A1 | 6/2006 | Osada et al. | |
| 2007/0295949 A1 * | 12/2007 | Lee ............................. | 257/4 |

OTHER PUBLICATIONS

Korean Patent Office, International Search Report and Written Opinion issued in corresponding PCT Application No. PCT/US2008/057726, 8 pgs., Aug. 25, 2008.

* cited by examiner

*Primary Examiner*—Huan Hoang
*Assistant Examiner*—Kretelia Graham
(74) *Attorney, Agent, or Firm*—Trop, Pruner & Hu, P.C.

(57) ABSTRACT

A phase change memory includes a plurality of cells for storing data in the form of respective resistance levels, addressing circuits for addressing cells to be programmed, and the resistance levels are determined from comparison of cell currents of addressed cells with a reference current. A reference generator provides the sense amplifier with the reference current. The reference generator is provided with a reference select circuit to select the reference current from a plurality of verify currents based on program data to be stored in the cell.

13 Claims, 7 Drawing Sheets

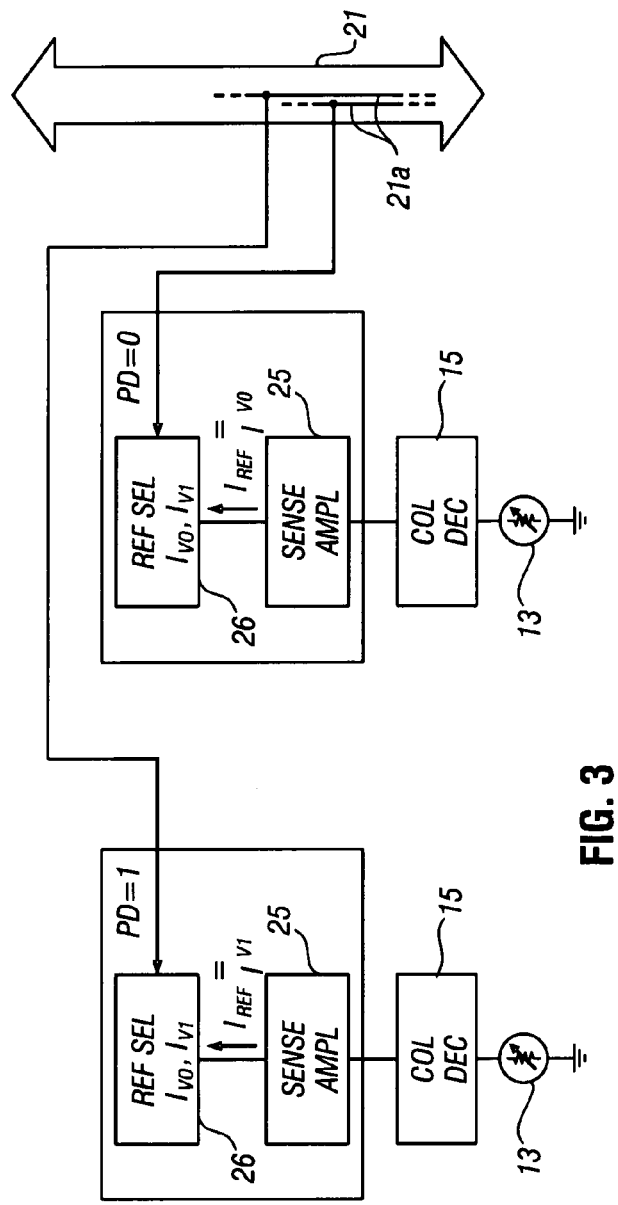
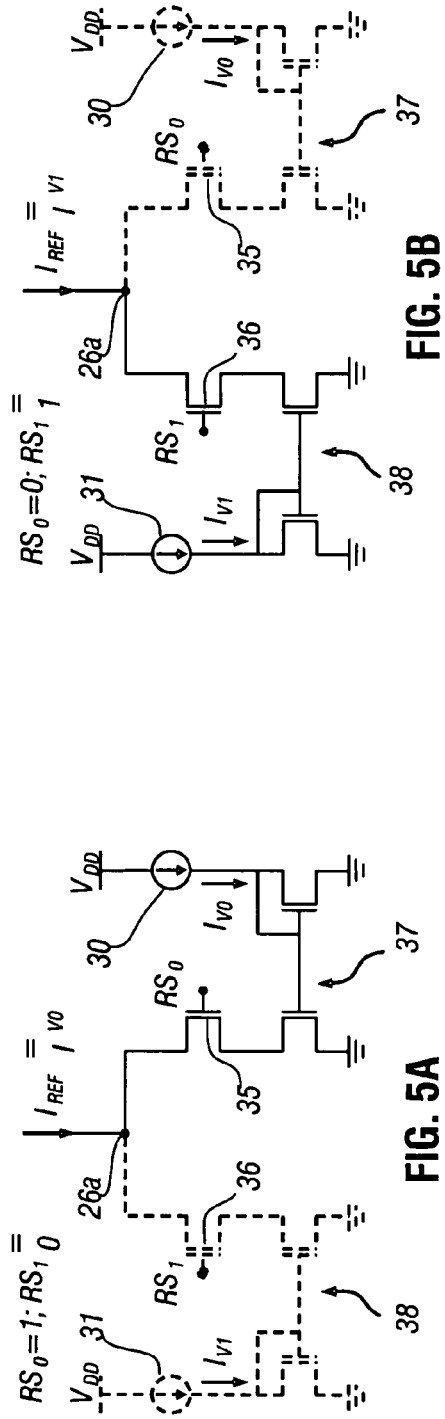
FIG. 3
FIG. 5A
FIG. 5B

PHASE CHANGE MEMORY WITH PROGRAM/VERIFY FUNCTION

BACKGROUND

This relates to a phase change memory device.

Phase change memory arrays use a class of materials which have the property of changing between two phases having distinct electrical characteristics. For example, these materials may change from an amorphous phase, which is disorderly, to a crystalline or polycrystalline phase, which is orderly, and the two phases are associated to considerably different values of resistivity.

At present, alloys of elements of group VI of the periodic table, such as Te or Se, referred to as chalcogenides or chalcogenic materials, can advantageously be used in phase change cells. The chalcogenide that currently offers the most promise is formed by a Ge, Sb and Te alloy (Ge2Sb2Te5) and is widely used for storing information in overwritable disks.

In chalcogenides, the resistivity varies by two or more orders of magnitude when the material passes from the amorphous phase (more resistive) to the crystalline phase (more conductive) and vice versa.

Phase change may be obtained by locally increasing the temperature. Below 150° C. both phases are stable. Above 200° C. (nucleation starting temperature Tx), there takes place fast nucleation of the crystallites, and, if the material is kept at the crystallization temperature for a sufficient length of time (time t2), it changes its phase and becomes crystalline. To bring the chalcogenide back into the amorphous state, it is necessary to raise the temperature above the melting temperature Tm (approximately 600° C.) and then to cool the chalcogenide off rapidly.

From the electrical standpoint, it is possible to reach both critical temperatures, namely the crystallization temperature and the melting point, by causing a current to flow through a resistive element which heats the chalcogenic material by Joule effect.

BRIEF DESCRIPTION OF THE DRAWINGS

For the understanding of the present invention, some preferred embodiments thereof will be now described, purely as non-limitative examples, with reference to the enclosed drawings, wherein:

FIG. 3 is a more detailed block diagram of a portion of the phase change memory device of FIG. 1;

FIGS. 5a and 5b show elements of the phase change memory device of FIG. 1 in a first and a second operating condition, respectively;

DETAILED DESCRIPTION

Figure 1:
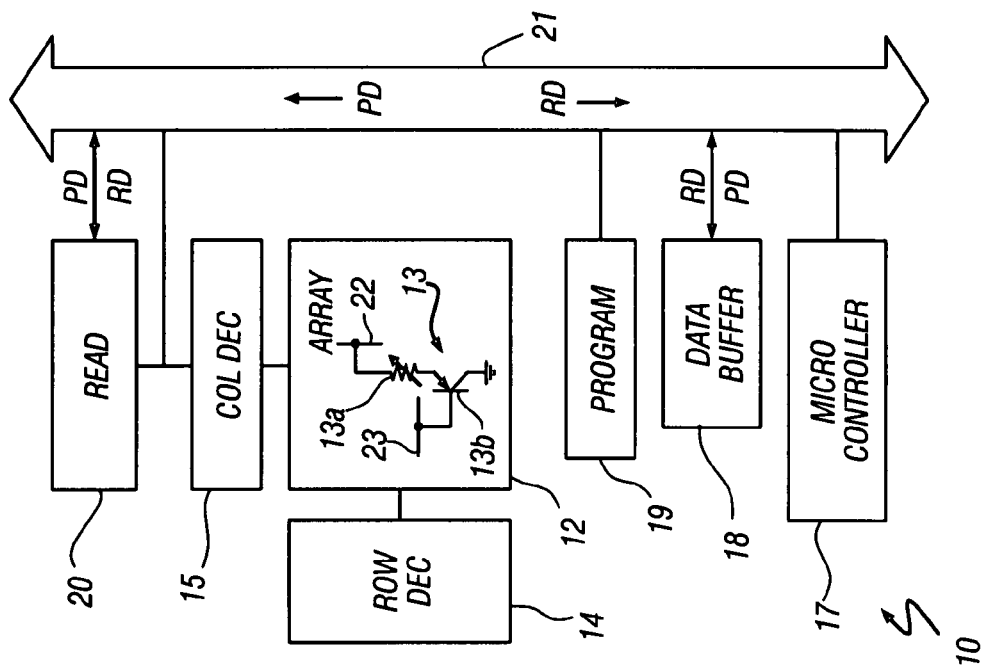
FIG. 1 shows a simplified block diagram of a phase change memory device according to a first embodiment of the present invention.

With reference to FIG. 1, a phase change memory device 10 comprises an array 12 of cells 13 arranged in rows and columns and accessible through a row decoder circuit 14 and a column decoder circuit 15. The phase change memory device 10 further comprises a microcontroller 17, a data buffer 18, a program circuit 19 and a read circuit 20, all communicating through a bidirectional data bus 21.

FIG. 1 also illustrates a cell 13 of the array 12. All cells 13 may be identical and may include each a phase change memory element 13a and a select device 13b coupled in series. The phase change memory element 13a includes a portion of a phase change material and is therefore suitable for storing data in form of respective resistance levels associated with different phases of the phase change material. The phase change memory element 13a is a resistor having variable resistance level. In one embodiment, the select devices 13b are PNP bipolar transistors controlled to allow current flow through selected memory elements 13a during read and program/verify operations. Cells 13 are further connected to respective bitlines 22 (directly) and word lines 23 (through the select devices 13b). In one embodiment, cells 13 allow two different programmable resistance levels to store one bit each. However, the invention may be exploited using arrays of multilevel cells capable of storing more than one bit each.

Cells 13 may be organized in a plurality of partitions that are structurally identical to one another. Partitions are, in turn, divided in a plurality of identical tiles.

The microcontroller 17 determines the direction of data flow through the data bus 21 during read, program and verify operations, e.g., by setting a flag. In particular, the microcontroller 17 gives control of the data bus 21 selectively to the program circuit 19 or to the read circuit 20, depending on operations to be carried out.

The data buffer 18 is coupled to provide data from the array 12 and to receive data to be stored therein. The program circuit 19 sends program pulses to groups of selected cells in response to program signals provided by the microcontroller 17.

Figure 2:
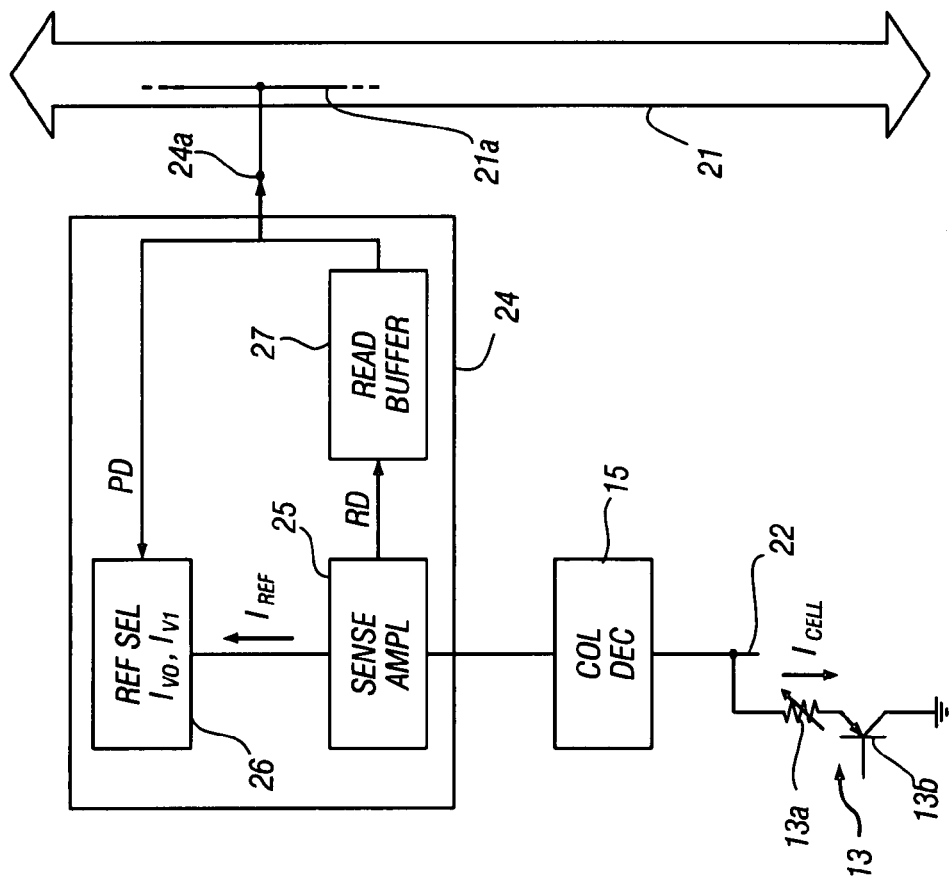
FIG. 2 is a more detailed block diagram of a portion of the phase change memory device of FIG. 1.

The read circuit 20 detects levels stored in selected cells 13 during read and verify operations. The read circuit 20 comprises a plurality of read modules 24, one of which is illustrated in FIG. 2. In one embodiment, several read modules 24 are associated with each partition and with each tile of the phase change memory device 10, providing parallel read and program/verify capability.

Each read module 24 includes a sense amplifier 25, a reference generator 26 and a read buffer 27. The sense amplifier 25 is selectively connectable to one of a plurality of bitlines 22 through the column decoder circuit 15. Thus, when a cell 13 that is connected to the selected bitline 22 is addressed for read or verify operations, a cell current $I_{CELL}$ flows from the sense amplifier 25 to the selected cell 13.

The reference generator 26 has an input connected to a data terminal 24a of the read module 24 that is, in turn, coupled to a respective data line 21a of the data bus 21. When the data bus 21 is controlled by the program circuit 19 to carry data from the data buffer 18 to the read circuit 20, the reference generator 26 receives program data PD (to be stored in the array 12) through the data terminal 24a. The reference generator 26 is also coupled to the sense amplifier 25 for supplying a selectable reference current $I_{REF}$. The reference generator 26 may draw the reference current $I_{REF}$ from the sense amplifier 25.

The reference current $I_{REF}$ is selected from a first verify current $I_{V0}$ and a second verify current $I_{V1}$, based on the program data PD supplied to the reference generator 26. The first verify current $I_{V0}$ and the second verify current $I^{V1}$ correspond to two resistance levels for selected cells 13. In one embodiment, both the first verify current $I_{V0}$ and the second verify current $I_{V1}$ are simultaneously available, and only the appropriate current is selected based on the program data PD to be stored in the corresponding addressed PCM cell 13. Therefore, the first verify current $I_{V0}$ and the second verify current $I_{V1}$ may be simultaneously selected for different cells 13 in which "0" and "1" bit values are to be stored, respectively.

The reference generators 26, shown in FIG. 3, provide the sense amplifiers 25 with respective selectable reference currents $I_{REF}$, according to program data to be stored in the addressed cell 13. Program data PD to be stored in the two cells 13 are "0" and "1", respectively. For the cell 13 receiving "0", the first verify current $I_{V0}$ is selected as the reference current $I_{REF}$. At the same time, the second verify current $I_{V1}$ is selected as the reference current $I_{REF}$ for the cell 13 receiving "1". The read buffer 27 (FIG. 2) may be a three-state buffer having an input connected to the sense amplifier 25 for receiving read data RD and an output connected to the data terminal 24a of the read module 24, for returning read data RD to the data buffer 18 when the data bus 21 is controlled to carry data from the read circuit 20 to the data buffer 18. As long as data flow is reversed (i.e. from the data buffer 18 to the read circuit 20), the read buffer 27 is set in a high-impedance state.

Program/verify operation of the phase change memory device 10 is as follows. First, a group of cells 13 are selected for programming through the row decoder circuit 14 and the column decoder circuit 15 and program data PD to be stored therein are loaded in the data buffer 18. Then, program pulses are sent by the program circuit 19 to the selected cells 13, in a conventional manner. Selected cells 13 are programmed in a single program cycle, irrespective of the data to be stored in each.

In a verify step, the microcontroller 17 sets a first data flow direction by giving control of the data bus 21 to the program circuit 19, that operates the data buffer 18 so that it sends program data PD to be stored in selected cells 13 to read modules 24 respectively connected thereto. Program data PD are loaded in the reference generators 26 of the read circuits 20 and used to select the appropriate reference currents $I_{REF}$. In particular, the first reference current $I_{V0}$ is selected as the reference current $I_{REF}$ if the program data PD to be stored in the corresponding cell 13 is "0" and the second reference current $I_{V1}$ is selected when the program data PD to be stored is "1". The read buffer 27 of the read modules 24 are all in the high-impedance state.

Selected cells 13 are then read by the sense amplifiers 25, that use the reference currents $I_{REF}$ provided by the respective reference generators 26. Read data RD, correlated to resistance levels of the selected cells 13, are latched in the read buffers 27 and represent the result of comparison between the cell current $I_{CELL}$ flowing trough each selected cell 13 and the reference current $I_{REF}$ supplied to the respective sense amplifier 25. Namely, the sense amplifiers 25 provide a first logic value, when the cell current $I_{CELL}$ of the coupled cell 13 is greater than the respective reference current $I_{CELL}$ and the coupled cell 13 is already programmed at the requested resistance level, and a second logic value otherwise (in this case, the corresponding cells 13 need further program pulses). The read buffers 27 of the read modules 24 are still in the high-impedance state at this point.

Once read data RD have been latched in the read buffers 27, the microcontroller 17 reverses data flow direction through the data bus 21 and gives control thereof to the read circuit 20 (thereby, a second data flow direction is set). The read buffers 27 are set in the low-impedance state, so that they are able to drive the data bus 21 and return read data RD to the data buffer 18. On the contrary, the program circuit 19 is set in the high-impedance state. Read data RD are then used by the microcontroller 17 to decide which cells 13, if any, require further program pulses to reach the desired resistance level.

Thus, a single verify cycle is requested to verify all selected cells 13, irrespective of the data that have been programmed therein.

Figure 4:
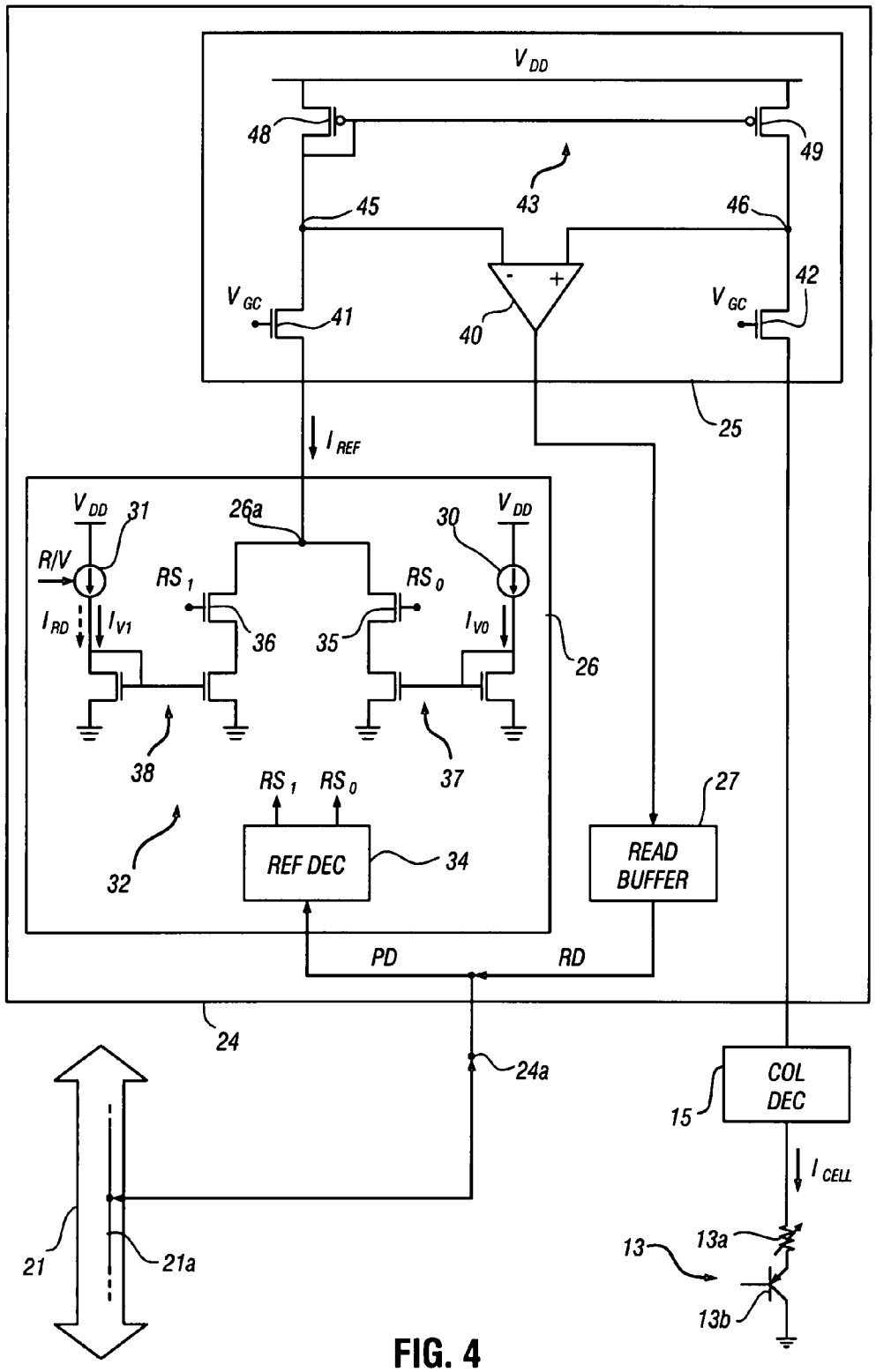
FIG. 4 is a simplified electric diagram of a particular of FIG. 3.

As shown in FIG. 4, the reference generator 26 comprises a first current generator 30, that supplies the first verify current $I_{V0}$, a second current generator 31, that supplies the second verify current $I_{V1}$, and a reference select circuit 32, for supplying selectively one of the first verify current $I_{V0}$ and the second verify current $I_{V1}$ as the reference current $I_{REF}$ for the sense amplifier 25.

The second current generator 31 is controlled by the microcontroller 17 by means of a read/verify signal R/V, to provide a read current $I_{RD}$ (dashed line in FIG. 4) during read operations. The read current $I_{RD}$ is intermediate between the first the first verify current $I_{V0}$ and the second verify current $I_{V1}$.

The reference selector circuit 32 includes a reference decoder 34, coupled to the data terminal 24a for receiving program data PD, a first reference selector transistor 35, a second reference selector transistor 36, and a first current mirror 37 and a second current mirror 38, both formed by NMOS transistors.

The reference decoder 34 provides a first reference selection signal $RS_0$ and a second reference selection signal $RS_1$ for the first reference select transistor 35 and the second reference select transistor 36, respectively. Based on the program data PD, the reference decoder 34 sets selectively one of the first reference selection signal $RS_0$ and second reference selection signal $RS_1$ at a selection value (e.g. "1"), and the other one at a deselection value (e.g. "0"). More precisely, the first reference selection signal $RS_0$ is set at the selection value and the second reference selection signal $RS_1$ is set at the deselection value the for selecting the first verify current $I_{V0}$; vice versa, the first reference selection signal $RS_0$ is set at the deselection value and the second reference selection signal $RS_1$ is set at the selection value the for selecting the second verify current $I_{V1}$.

During a read operation, the reference decoder 34 sets a default configuration, in which the first reference selection signal $RS_0$ is set at the deselection value and the second reference selection signal $RS_1$ is set at the selection value. Thus, the second current generator 31 is coupled to the sense amplifier 25, so that the read current $I_{RD}$ is mirrored and provided as the reference current $I_{REF}$.

The first current mirror 37 and the second current mirror 38 are configured to mirror the first verify current $I_{V0}$ and the second verify current $I^{V1}$, respectively, through the first reference select transistor 35 and the second reference select transistor 36 (when conducting). To this end, mirror terminals of the first current mirror 37 and of the second current mirror 38 are connected to source terminals of the first reference select transistor 35 and of the second reference select transistor 36, respectively.

Moreover, the first reference select transistor 35 and the second reference select transistor 36, both of NMOS type, have drain terminals coupled to a common reference selection node 26a and respectively receive the first reference selection signal $RS_0$ and the second reference selection signal $RS_1$ on their gate terminals. Thus, selectively one of the first reference select transistor 35 and the second reference select transistor 36 may be turned on and conduct at a time, whereas the other one is cut off (namely, the one receiving the reference selection signal $RS_0$, $RS_1$ at the selection value is on and the other one is off).

The reference selection node 26a is further connected to the sense amplifier 25 for providing the selected reference current $I_{REF}$. The sense amplifier 25 comprises a comparator 40, a first bias transistor 41, a second bias transistor 42 and a PMOS current mirror 43.

Conduction terminals of the first bias transistor 41 are respectively connected to the reference selection node 26a of the reference generator 26 and to a reference node 45. Conduction terminals of the second bias transistor 42 are respectively connected to a selected bitline 22 (through the column decoder circuit 15) and to a read node 46. A bias control voltage $V_{GC}$ is provided on gate terminals of both the bias transistors 41, 42.

The current mirror 43 includes a sense transistor 48, that is diode connected, and a mirror transistor 49. Drain terminals of the sense transistor 48 and of the mirror transistor 49 form sense and mirror terminals of the current mirror 43 and are coupled to the reference node 45 and to the read node 46, respectively. Therefore, the selected reference current $I_{REF}$ flows through the sense transistor 48, whereas the cell current $I_{CELL}$ of the selected cell 13 is forced through the mirror transistor 49.

The comparator 40 has non-inverting and inverting input terminals respectively connected to the reference node 45 and to the read node 46, and its output terminal is connected to the read buffer 27 for providing read data RD.

During a verify operation, the reference decoder 34 sets one of the first reference selection signal $RS_0$ and the second reference selection signal $RS_1$ at the selection value, based on received program data PD. Accordingly, although both first current generator 30 and the second current generator 31 are active during verify step to make the first verify current $I_{V0}$ and the second verify current $I_{V1}$ simultaneously available, only one of the first reference select transistor 35 and the second reference select transistor 36 is on. Thus, only one of the first verify current $I_{V0}$ and the second verify current $I^{V1}$ may be drawn from the reference selection node 26a and be in fact selected as the reference current $I_{REF}$, as schematically illustrated in FIGS. 5a and 5b.

In FIG. 5a, in particular, the first reference selection signal $RS_0$ is at the selection value, and the first verify current $I_{V0}$ flows through the first reference select transistor 35, that is on. Instead, no current flows through the second reference select transistor 35, that is cut off.

FIG. 5b illustrates the opposite condition, in which the second reference selection signal $RS_1$ is at the selection value. In this case, the second verify current $I_{V1}$ flows through the second reference select transistor 36 and is thus selected as the reference current $I_{REF}$, whereas the first reference select transistor 35 is cut off. Accordingly, the appropriate reference current $I_{REF}$ is selected for each addressed cell 13, based on the program data PD to be stored therein.

Referring back to FIG. 4, the selected reference current $I_{REF}$ is drawn from the sense amplifier 25 and compared with the cell current $I_{CELL}$ that flows through the selected cell 13. Namely, the cell current $I_{CELL}$ determines voltage on the read node 46 that is compared to voltage on the reference node 45 by the comparator 40. The result of comparison provides the read data RD that is sent to the read buffer 27.

Figure 6A:
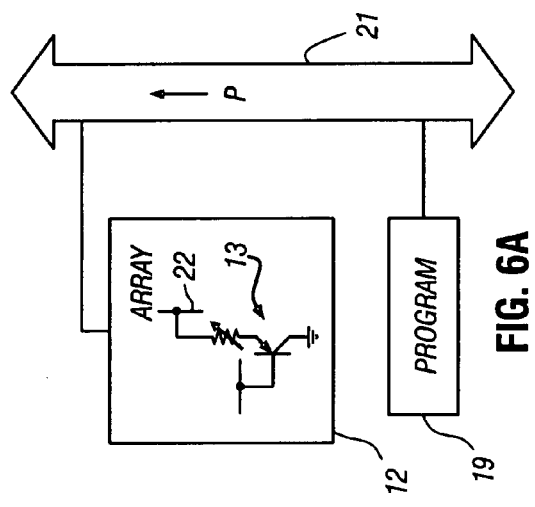
FIGS. 6a-6d schematically show data flow in the phase change memory device of FIG. 1, in respective operating conditions.
Figure 6B:
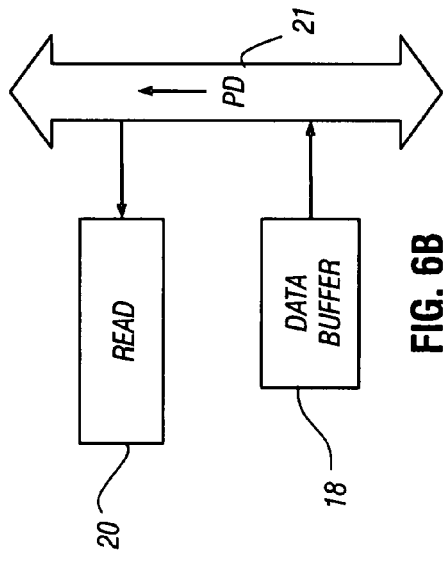
Figure 6C:
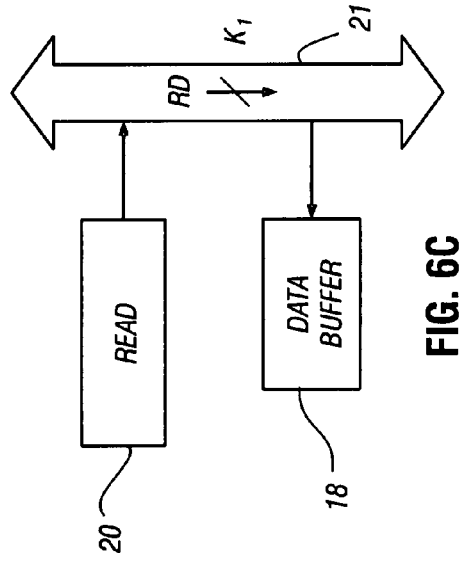
Figure 6D:
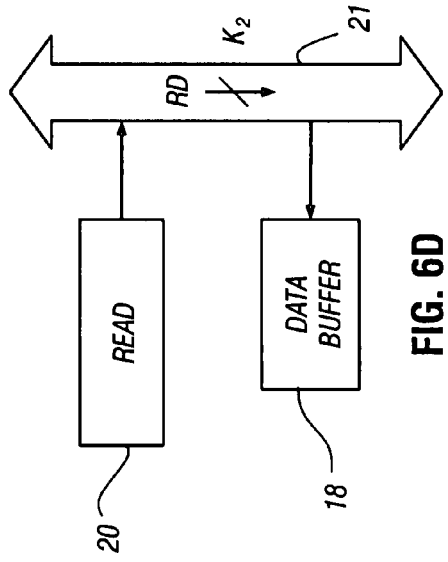

Data flow through the data bus 21 in program, verify and read operation is schematically summarized in FIGS. 6a-6d, which illustrate:
program pulses P sent by the program circuit 19 to selected cells 13 (program, FIG. 6a);
program data PD, from the data buffer 18 to the read modules 24 in the read circuit 20 (verify, FIG. 6b);
in verify operation, read data RD from the data buffers 27 of the read circuits 20 to the data buffer 18 (only from $K_1$ programmed cells, FIG. 6c);
in read operation, read data RD from the data buffers 27 of the read circuits 20 to the data buffer 18 ($K_2$ selected cells with $K_2 > K_1$, FIG. 6d).

In some embodiments, cells can be programmed to different resistance levels and simultaneously verified in a single verify cycle, because different cells may be simultaneously provided with different and appropriate verify reference currents. Thus, a memory device may be made substantially immune to program errors, without sacrificing time required to program cells in some embodiments.

Furthermore, three state buffers and a bidirectional bus allow area minimization in some cases. Read modules are in fact coupled to the data buffer in either communication direction over respective single lines of the data bus, instead of requiring separate lines for different directions, in one embodiment.

Figure 8:
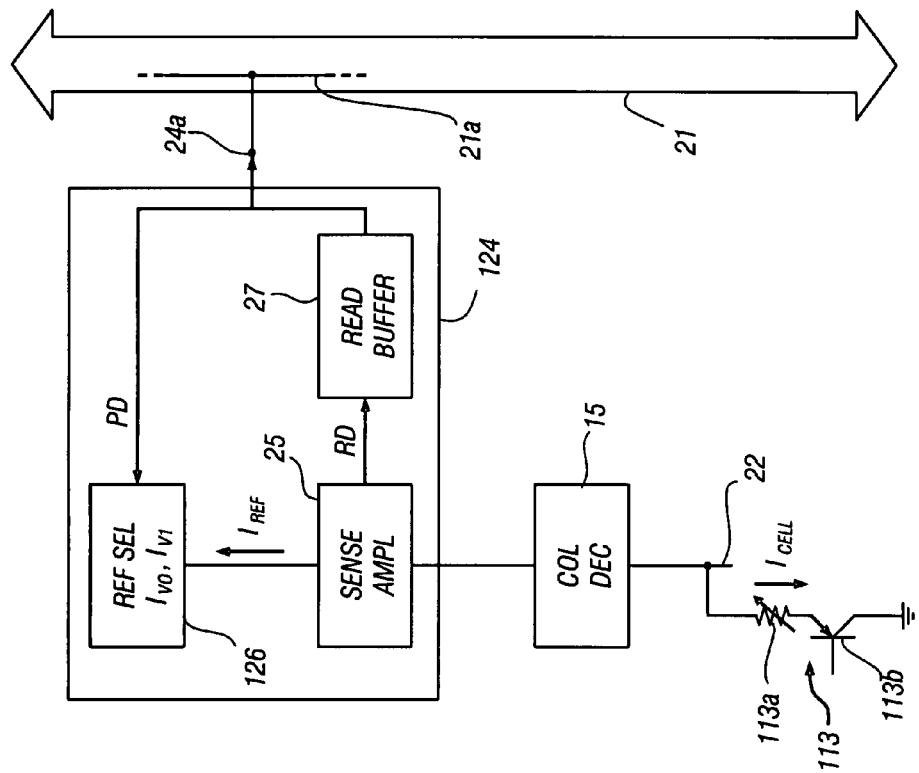
FIG. 8 is a more detailed block diagram of a portion of the phase change memory device of FIG. 7.
Figure 7:
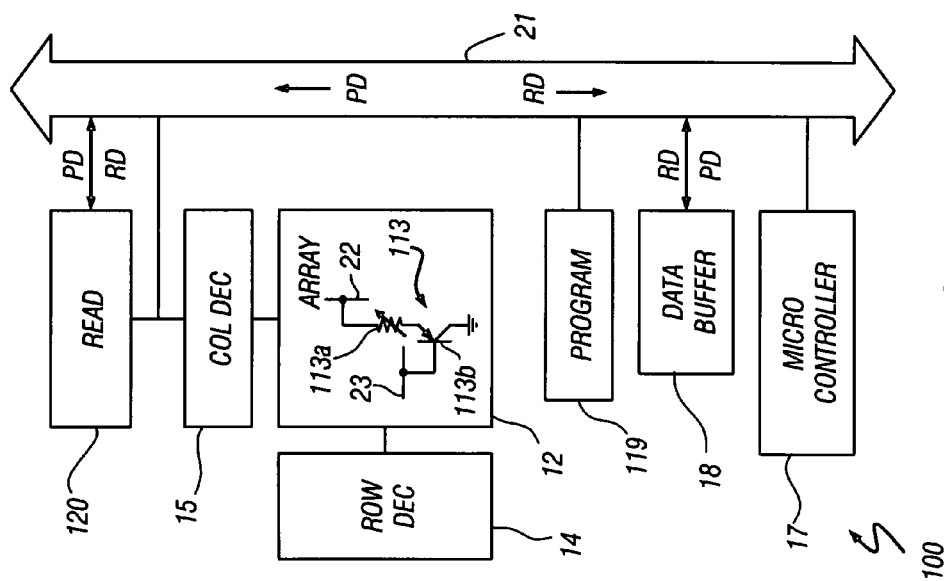
FIG. 7 shows a simplified block diagram of a phase change memory device according to a second embodiment of the present invention.
Figure 9:
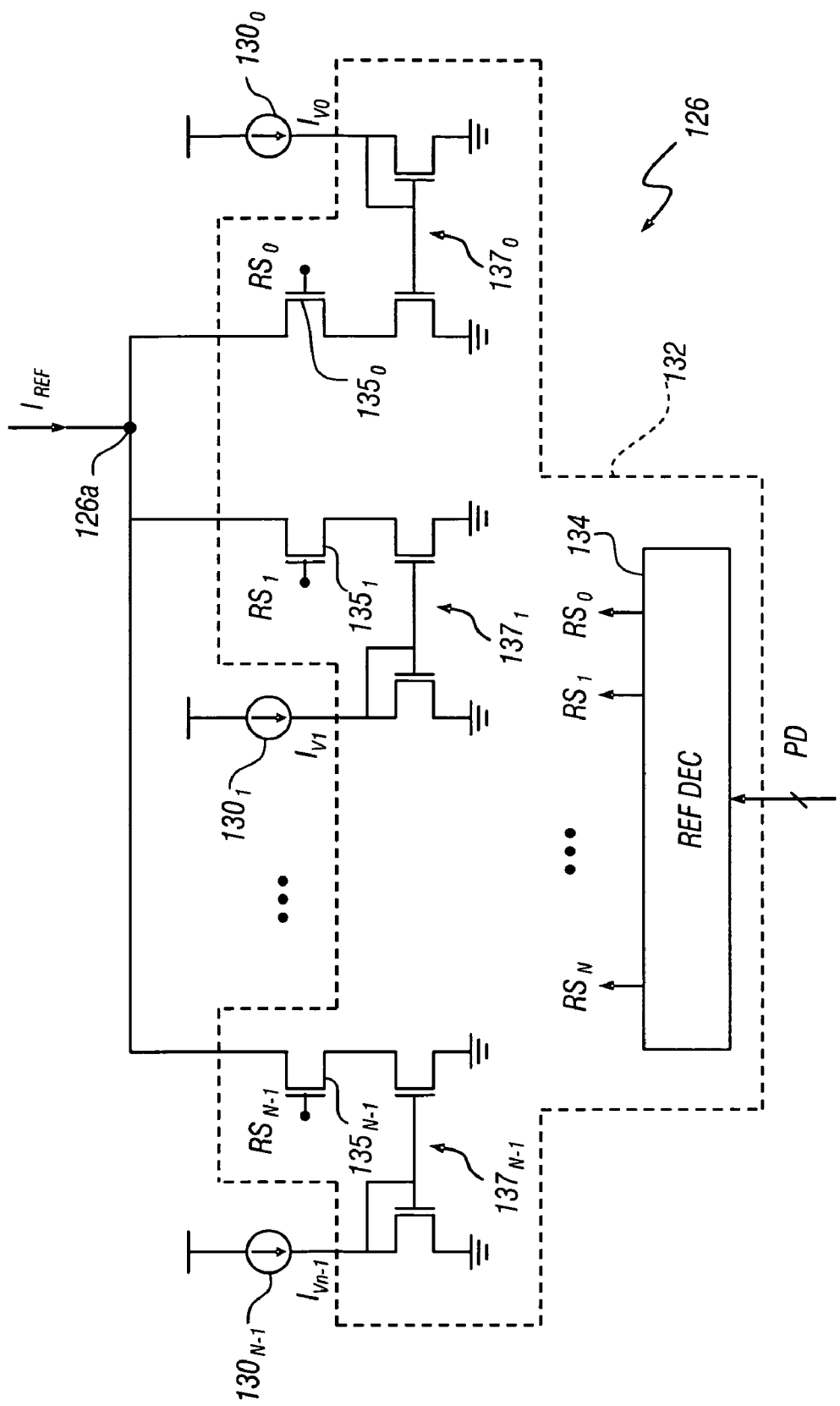
FIG. 9 is a simplified electric diagram of a particular of FIG. 7.

FIGS. 7-9, in which parts already shown are indicate by the same reference numerals, illustrate a second embodiment. According to this embodiment, a multilevel phase change memory device 100 includes an array of multilevel cells 113 capable of storing N bits each, a program circuit 119, and a read circuit 120 configured for multilevel read and program/verify operation.

In particular (FIG. 8), the read circuit 120 includes a plurality (N) of read modules 124 comprising each a multilevel reference generator 126, a sense amplifier 25 and an read buffer 27, as already described. The multilevel reference generator 126 is coupled to the sense amplifier 25 for providing a reference current $I_{REF}$. The reference current $I_{REF}$ is selected within a plurality of verify currents $I_{V0}, I_{V1}, \ldots, I_{VN-1}$, corresponding to respective resistance levels for selected cells 113a. The multilevel reference generator 126 is configured to select the appropriate verify current $I_{V0}, I_{V1}, \ldots, I_{VN-1}$ as the reference current $I_{REF}$, based on program data PD received from the data buffer 18. More precisely, all the verify currents $I_{V0}, I_{V1}, \ldots, I_{VN-1}$ are simultaneously available, and only the appropriate current is selected based on the program data PD to be stored in the corresponding addressed PCM cell 113.

The reference generator 126 (FIG. 9) comprises a plurality of current generators $130_0, 130_1, \ldots, 130_{N-1}$, respectively, supplying verify currents $I_{V0}, I_{V1}, \ldots, I_{VN-1}$ and a multilevel reference select circuit 132, for supplying selectively one of the verify currents $I_{V0}, I_{V1}, \ldots, I_{VN-1}$ as the reference current $I_{REF}$ for the sense amplifier 25.

The multilevel reference select circuit 132 includes a multilevel reference decoder 134 and one reference select transistor $135_0, 135_1, \ldots, 135_{N-1}$ and one current mirrors $137_0, 137_1, \ldots, 137_{N-1}$ for each current generator $130_0, 130_1, \ldots, 130_{N-1}$.

The current mirrors $137_0, 137_1, \ldots, 137_{N-1}$ are configured to mirror a verify current $I_{V0}, I_{V1}, \ldots, I_{VN-1}$, from a respective current generator $130_0, 130_1, \ldots, 130_{N-1}$ into a respective reference select transistors $135_0, 135_1, \ldots, 135_{N-1}$, when the latter is on. In particular, reference select transistors $135_0$, $135_1, \ldots, 135_{N-1}$ have drain terminals connected to a common reference selection node $126a$ and source terminals coupled to mirror terminals of respective current mirrors $137_0, 137_1, \ldots, 137_{N-1}$.

The multilevel reference decoder 134 receives the program data PD and provides a plurality of reference selection signals $RS_0, RS_1, \ldots, RS_{N-1}$, one for each reference select transistor $135_0, 135_1, \ldots, 135_{N-1}$. Moreover, multilevel reference decoder 134 is configured to set selectively one of the of reference selection signals $RS_0, RS_1, \ldots, RS_{N-1}$ at a selection value, for turning on the corresponding reference select transistor $135_0, 135_1, \ldots, 135_{N-1}$. Other reference selection signals $RS_0, RS_1, \ldots, RS_{N-1}$ are instead set at a deselection value and the corresponding reference select transistor $135_0, 135_1, \ldots, 135_{N-1}$ are cut off.

Accordingly, the appropriate reference current $I_{REF}$ may be selected for each addressed cell 113, irrespective of whether the same or different program data PD are to be stored. The verify step may carried out simultaneously for cells that are to be programmed at different resistance levels.

Figure 10:
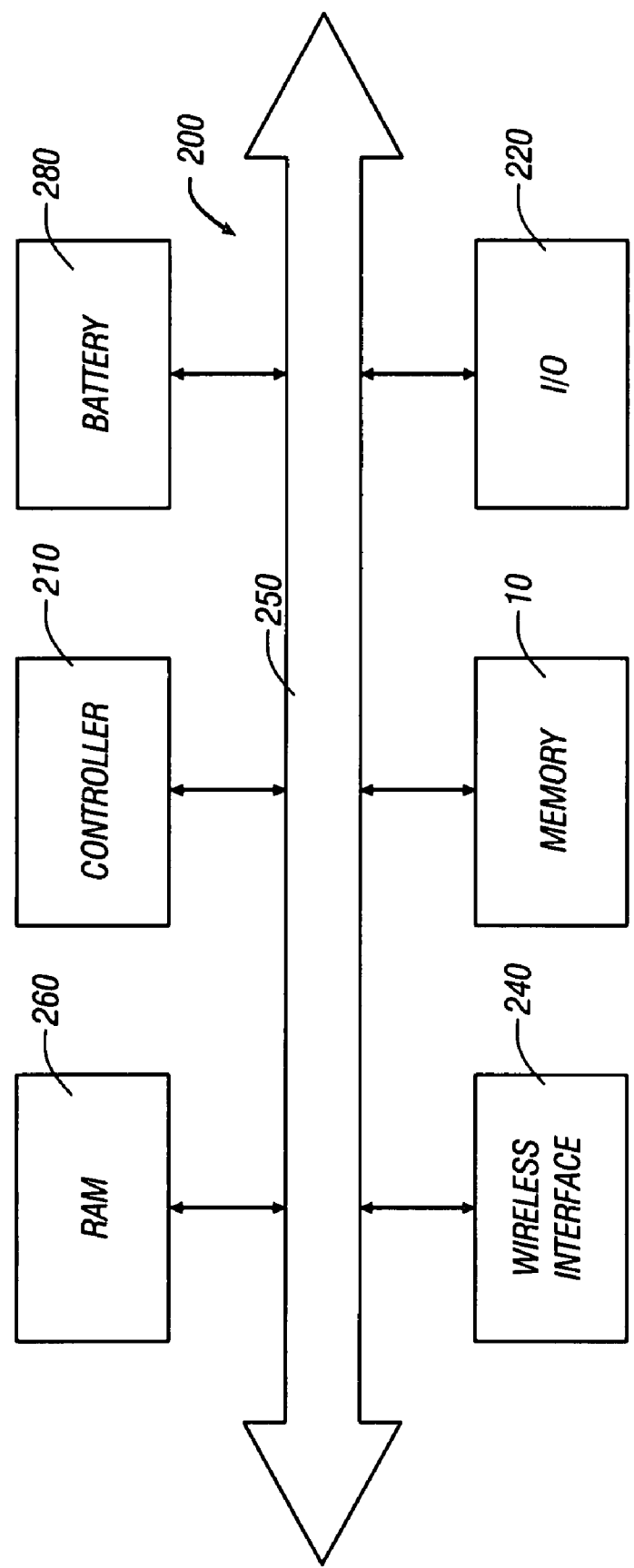
FIG. 10 is a system depiction of one embodiment of the present invention.

In FIG. 10, a portion of a system 200 in accordance with an embodiment of the present invention is illustrated. System 200 may be used in devices such as, for example, a personal digital assistant (PDA), a laptop or portable computer, possibly with wireless capability, a cellphone, a messaging device, a digital music player, a digital camera, or other devices that may be adapted to process, store, transmit or receive information and require permanent storage capability.

System 200 may include a controller 210, an input/output (I/O) device 220 (e.g. a keyboard, display), the phase change memory device 10, a wireless interface 240, and a RAM memory 260, coupled to each other via a bus 250. A battery 280 may be used to supply power to the system 200 in one embodiment. It should be noted that the scope of the present invention is not limited to embodiments having necessarily any or all of above listed components.

Controller 210 may comprise, for example, one or more microprocessors, digital signal processors, micro-controllers, or the like.

The I/O device 220 may be used to generate a message. The system 200 may use the wireless interface 240 to transmit and receive messages to and from a wireless communication network with a radio frequency (RF) signal. Examples of the wireless interface 240 may include an antenna, or a wireless transceiver, such as a dipole antenna, although the scope of the present invention is not limited in this respect. Also, the I/O device 220 may deliver a voltage reflecting what is stored as either a digital output (if digital information was stored), or as analog information (if analog information was stored).

Finally, it is clear that numerous modifications and variations may be made to the device and the method described and illustrated herein, all falling within the scope of the invention, as defined in the attached claims. In particular, in place of a plurality of current generators, the reference generators may comprise controllable current generators providing controllable verify currents. The controllable current generators may be controlled by the respective reference decoders to provide the requested verify currents, based on program data to be stored in the corresponding addressed cell.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
   a plurality of cells;
   a reference generator to select a reference current from a plurality of verify currents based on program data to be stored in an addressed cell;
   a bidirectional bus;
   a read buffer, coupled to said bus, to store states to be programmed into said cells;
   a data buffer, coupled to said bus, to store the data actually programmed into said cells; and
   a controller to control the bus direction to transfer programmed cell states from the read buffer to the data buffer to enable verification of programmed states and to reverse the bus direction to transfer data from the data buffer to the read buffer to program said cells.

2. The memory of claim 1 wherein said reference generator provides more than two verify currents.

3. The memory of claim 1 wherein said reference generator is controllable to supply a read current during read operations and a reference decoder is configured to set a default configuration.

4. The memory of claim 1 wherein the reference generator to simultaneously provide different addressed cells with different reference currents.

5. The memory of claim 1 wherein said cells are multilevel cells.

6. A system comprising:
   a processor; and
   a phase change memory including a plurality of cells, a reference generator to select a reference current from a plurality of verify currents based on program data to be stored in an addressed cell, a bidirectional bus, a read buffer, coupled to said bus, to store states to be programmed into said cells, a data buffer, coupled to said bus, to store the data actually programmed into said cells, and a controller to control the bus direction to transfer programmed cell states from the read buffer to the data buffer to enable verification of programmed states and to reverse the bus direction to transfer data from the data buffer to the read buffer to program said cells.

7. The system of claim 6 wherein said reference generator provides more than two verify currents.

8. The system of claim 6 wherein said reference generator to select a verify current based on program data to be stored.

9. The system of claim 8 wherein said reference generator is controllable to supply a read current during read operations and a reference decoder is configured to set a default configuration.

10. The system of claim 6 wherein the reference generator to simultaneously provide different addressed cells with different reference currents.

11. A method comprising:
    addressing cells to be programmed;
    programming said cells by storing data in the form of respective resistance levels;
    providing a reference current;

determining a resistance level data correlated to a resistance level of said cells from comparison of cell currents of addressed cells with the reference current; and changing a bus direction to transfer programmed cell states over said bus from a read buffer to a data buffer to enable verification of programmed states and to reverse the bus direction and transfer data over said bus from the data buffer to the read buffer to program said cells.

12. The method of claim 11 wherein the selecting comprises:

receiving program data to be stored in addressed cells;

supplying received program data to reference select circuits associated to respective addressed cells; and operating the reference select circuits with supplied program data.

13. The method of claim 12 wherein determining includes storing resistance levels data in read buffers and returning the resistance levels data.

\* \* \* \* \*